(12) United States Patent
Carvajal et al.

(10) Patent No.: US 7,202,710 B2
(45) Date of Patent: Apr. 10, 2007

(54) APPARATUS AND METHOD FOR HANDLING INTERDEVICE SIGNALING

(75) Inventors: Fernando D. Carvajal, Fairview, TX (US); Yanli Fan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/836,522

(22) Filed: Apr. 30, 2004

(65) Prior Publication Data

US 2005/0242846 A1    Nov. 3, 2005

(51) Int. Cl.
 H03B 1/00    (2006.01)
 H03K 3/00    (2006.01)

(52) U.S. Cl. .................. 327/108; 327/170; 326/82; 326/86

(58) Field of Classification Search ............. 327/108, 327/112, 170, 333; 326/26, 27, 22, 23, 24, 326/62, 68, 82, 83, 86
See application file for complete search history.

(56) References Cited

U.S. PATENT DOCUMENTS

| | | | | |
|---|---|---|---|---|
| 5,391,939 A | * | 2/1995 | Nonaka | 326/83 |
| 5,495,197 A | * | 2/1996 | Hayashi et al. | 327/276 |
| 5,500,610 A | * | 3/1996 | Burstein | 326/85 |
| 5,576,634 A | * | 11/1996 | Kamiya | 326/26 |
| 5,698,991 A | * | 12/1997 | Kamiya | 326/26 |
| 6,294,933 B1 | * | 9/2001 | Chun et al. | 326/86 |
| 6,366,151 B1 | * | 4/2002 | Nakamura | 327/281 |
| 6,628,150 B1 | | 9/2003 | Carvajal et al. | 327/108 |
| 6,794,900 B2 | * | 9/2004 | Tang et al. | 326/86 |
| 6,812,733 B1 | * | 11/2004 | Plasterer et al. | 326/30 |
| 2003/0025542 A1 | * | 2/2003 | Humphrey | 327/170 |

* cited by examiner

Primary Examiner—Tuan T. Lam
(74) Attorney, Agent, or Firm—W. James Brady; Frederick J. Telecky, Jr.

(57) ABSTRACT

An apparatus for handling signaling between a sending device and a receiving device includes: (a) a buffering amplifier device having at least one input locus for receiving an input signal from the receiving device and having at least one output locus for presenting an output signal for the receiving device; each respective at least one output locus presents an output signal in response to the input signal received at a respective input locus of the at least one input locus; (b) a feed forward circuit coupling each respective input locus with its respective corresponding output locus to provide a feed forward signal to the respective corresponding output locus; the feed forward signal is in phase with the input signal received at the respective input locus.

7 Claims, 5 Drawing Sheets

400 though intra-chip communications are easily carried out at desired high speeds. Chip-to-chip communication (i.e., inter-chip communication) often presents bottlenecks in certain aspects of design of a system, such as communications with motherboards, optical transmission links, intelligent network hubs, routers and other system components. If one of the inter-chip interfaces experiences slow communications, then the entire system is slowed.

APPARATUS AND METHOD FOR HANDLING INTERDEVICE SIGNALING

BACKGROUND OF THE INVENTION

The present invention is directed to driver apparatuses employed in inter-device communications signaling, and especially to such driver apparatuses employed in high speed communication systems.

In high speed communications systems such as, by way of example and not by way of limitation, data communication systems, speed of signal handling is less of a problem when effecting intra-chip communications than when carrying out inter-chip communications. Inter-chip high speed communication is generally limited by the performance of chip communication termination circuits, such as driver and receiver circuits at the interface of communicating chips. Speed of a driver circuit is generally indicated by the speed at which the driver circuit can effect signal transitions. Signal transitions—such as from a high signal level to a low signal level, or from a low signal level to a high signal level—are used in digital data communications to convey information. The speed at which the necessary information-indicating signal transitions can be carried out directly affects the speed of the communication system.

Inherent driver circuit limitations often limit speed of communication that can be achieved by a system. This is so even though intra-chip communications are easily carried out at desired high speeds. Chip-to-chip communication (i.e., inter-chip communication) often presents bottlenecks in certain aspects of design of a system, such as communications with motherboards, optical transmission links, intelligent network hubs, routers and other system components. If one of the inter-chip interfaces experiences slow communications, then the entire system is slowed.

Earlier attempts at increasing operational speed of driver apparatuses has involved, for example, sensing a signal downstream, such as at the driver output, and using that sensing to determine application of a boosting signal to an upstream driver locale, such as within the driver output circuitry. Such an approach to increasing speed of a driver apparatus is disclosed in U.S. Pat. No. 6,628,150 to Carvajal et al. for "System and Method to Speed-Up Operation of a Driver", issued Sep. 30, 2003. The problem with such an approach is that application of the remedial boosting signal necessarily occurs too late to aid in speeding the transition of the output signal that is sensed.

There is a need for an apparatus and method for handling interdevice signaling between a sending device and a receiving device that improves signaling speed between the sending device and the receiving device.

SUMMARY OF THE INVENTION

An apparatus for handling signaling between a sending device and a receiving device includes: (a) a buffering amplifier device having at least one input locus for receiving an input signal from the sending device and having at least one output locus for presenting an output signal for the receiving device; each respective at least one output locus presents an output signal in response to the input signal received at a respective input locus of the at least one input locus; (b) a feed forward circuit coupling each respective input locus with its respective corresponding output locus to provide a feed forward signal to the respective corresponding output locus; the feed forward signal is in phase with the input signal received at the respective input locus.

A method for handling signaling between a sending device and a receiving device includes the steps of: (a) in no particular order: (1) providing a buffering amplifier device having at least one input locus for receiving an input signal from the sending device and having at least one output locus for presenting an output signal for the receiving device; each respective at least one output locus presents an output signal in response to the input signal received at a respective input locus of the at least one input locus; and (2) providing a feed forward circuit coupling each respective input locus with its respective corresponding output locus to provide a feed forward signal to the respective corresponding output locus; and (b) operating the feed forward circuit to present the feed forward signal at the respective corresponding output locus in phase with the input signal received at the respective input locus.

It is, therefore, an object of the present invention to provide an apparatus and method for handling interdevice signaling between a sending device and a receiving device that improves signaling speed between the sending device and the receiving device.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
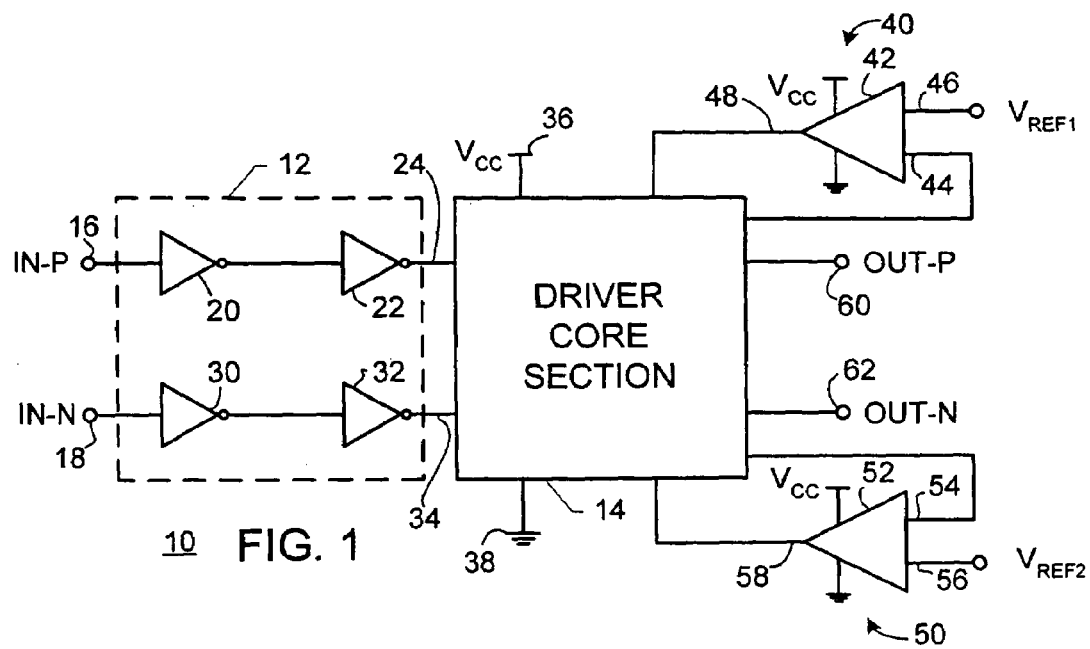
FIG. 1 is an electrical schematic diagram of a representative prior art driver apparatus.

FIG. 1 is an electrical schematic diagram of a representative prior art driver apparatus. In FIG. 1, a driver apparatus 10 includes an input section or locus 12 and a driver core section 14. Driver apparatus 10 is configured, by way of example and not by way of limitation, as a differential signaling driver receiving a first input signal IN-P at a first input terminal 16 and receiving a second input signal at a second input terminal 18. In representative driver circuit 10, input section 12 includes a pair of inverters 20, 22 coupled in series between first input terminal or locus 16 and a first core input terminal 24. Input section 12 also includes a pair of inverters 30, 32 coupled in series between second input terminal or locus 18 and a second core input terminal 34. Driver core section 14 receives a supply voltage $V_{CC}$ at a supply voltage input terminal 36. Driver core section 14 is coupled with ground 38.

A first regulating circuit 40 includes an amplifier 42 having a first input terminal 44 receiving a first input signal from driver core section 14 and a second input terminal 46 coupled to receive a first reference voltage $V_{REF1}$. An output terminal 48 is coupled to provide a first regulating signal to driver core section 14. The first regulating signal provided at output terminal 48 is dependent upon the relationship between signals appearing at input terminals 44, 46. A second regulating circuit 50 includes an amplifier 52 having a first input terminal 54 receiving a first input signal from driver core section 14 and a second input terminal 56 coupled to receive a second reference voltage $V_{REF2}$. An output terminal 58 is coupled to provide a second regulating signal to driver core section 14. The second regulating signal provided at output terminal 58 is dependent upon the relationship between signals appearing at input terminals 54, 56. Regulating circuits 40, 50 cooperate to regulate common mode voltage of differential output signals presented at output loci 60, 62 as current varies at output loci 60, 62.

Driver apparatus 10 presents output signals at output terminals or loci 60, 62.

Figure 2:
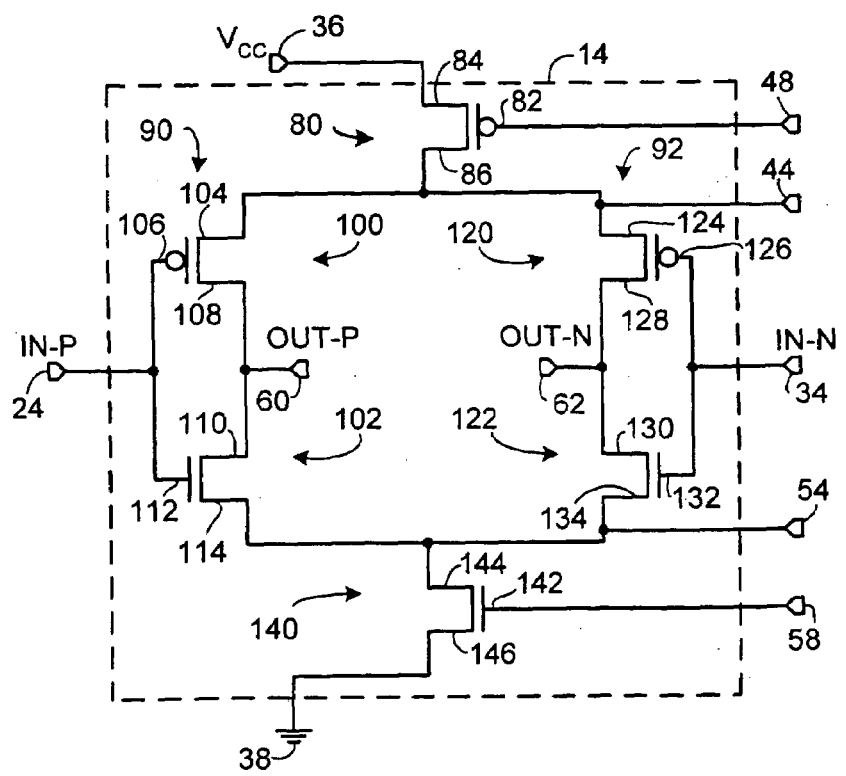
FIG. 2 is an electrical schematic diagram of a representative driver core section for the prior art driver apparatus illustrated in FIG. 1.

FIG. 2 is an electrical schematic diagram of a representative driver core section for the prior art driver apparatus illustrated in FIG. 1. In FIG. 2, a driver core section 14 is configured as a buffering amplifier device that includes a transistor 80 coupled with supply voltage input terminal 36. Transistor 80 has a gate 82 and a source 84. Source 84 is coupled with supply voltage input terminal 36. Transistor 80 has a drain 86 coupled with parallel buffering circuits 90, 92. Output terminal 48 (FIG. 1) is coupled with gate 82 so that first regulating signals provided at output terminal 48 cooperate with transistor 80 in regulating supply of supply voltage $V_{CC}$ to buffering circuits 90, 92.

Buffering circuit 90 includes transistors 100, 102 coupled in series. Transistor 100 receives a regulated voltage from transistor 80 at a source 104. Transistor 100 has a gate 106 and a source 104. Source 104 is coupled with drain 86 of transistor 80. Transistor 100 has a drain 108 coupled with output terminal or locus 60. Transistor 102 has a drain 110, a gate 112 and a source 114. Gate 112 is coupled with gate 106 and coupled with input locus 24.

Buffering circuit 92 includes transistors 120, 122 coupled in series. Transistor 120 receives a regulated voltage from transistor 80 at a source 124. Transistor 120 has a gate 126 and a source 124. Source 124 is coupled with drain 86 of transistor 80. Transistor 120 has a drain 128 coupled with output terminal or locus 62. Transistor 122 has a drain 130, a gate 132 and a source 134. Gate 132 is coupled with gate 126 and coupled with input locus 34.

Sources 104, 124 are coupled in common and coupled with first input terminal 44 of first regulating circuit 40 (FIG. 1).

A transistor 140 has a drain 144 coupled with sources 114, 134 and with first input terminal 54 of second regulating circuit 50 (FIG. 1). Transistor 140 has a gate 142 and a source 146. Source 146 is coupled with ground 38. Output terminal 58 (FIG. 1) is coupled with gate 142 So that second regulating signals provided at output terminal 58 cooperate with transistor 140 in regulating voltage at sources 114, 134.

Figure 3:
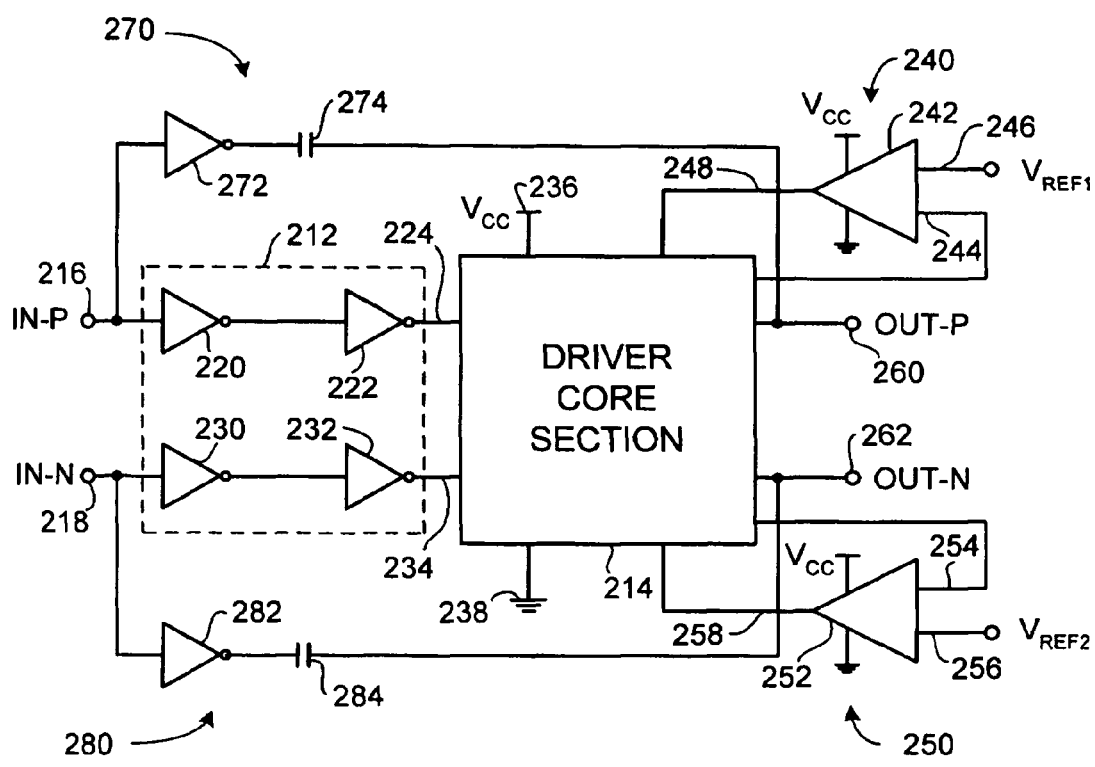
FIG. 3 is an electrical schematic diagram of a driver apparatus employing the preferred embodiment of the present invention.

FIG. 3 is an electrical schematic diagram of a driver apparatus employing the preferred embodiment of the present invention. In FIG. 3, a driver apparatus 200 includes an input section or locus 212 and a driver core section 214. Preferably, driver core section 214 is configured substantially as a buffering amplifier device of the sort illustrated in FIG. 2 (not shown in detail in FIG. 3). Driver apparatus 200 is configured, by way of example and not by way of limitation, as a differential signaling driver receiving a first input signal IN-P at a first input terminal 216 and receiving a second input signal at a second input terminal 218. Driver apparatus 200 may be configured for handling single-ended signaling without departing from the scope of the present invention. In representative driver circuit 200, input section 212 includes a pair of inverters 220, 222 coupled in series between first input locus 216 and a first core input terminal 224. Input section 212 also includes a pair of inverters 230, 232 coupled in series between second input locus 218 and a second core input terminal 234. Driver core section 214 receives a supply voltage $V_{CC}$ at a supply voltage input terminal 236. Driver core section 214 is coupled with ground 238.

A first regulating circuit 240 includes an amplifier 242 having a first input terminal 244 receiving a first input signal from driver core section 214 and a second input terminal 246 coupled to receive a first reference voltage $V_{REF1}$. An output terminal 248 is coupled to provide a first regulating signal to driver core section 214. The first regulating signal provided at output terminal 248 is dependent upon the relationship between signals appearing at input terminals 244, 246. A second regulating circuit 250 includes an amplifier 252 having a first input terminal 254 receiving a first input signal from driver core section 214 and a second input terminal 256 coupled to receive a second reference voltage $V_{REF2}$. An output terminal 258 is coupled to provide a second regulating signal to driver core section 214. The second regulating signal provided at output terminal 258 is dependent upon the relationship between signals appearing at input terminals 254, 256. Regulating circuits 240, 250 cooperate to regulate common mode voltage of differential output signals presented at output loci 260, 262 as supply voltage $V_{CC}$ varies.

Driver apparatus 200 presents output signals at output terminals or loci 260, 262.

Driver apparatus 200 also includes feed-forward circuits 270, 280. Feed-forward circuit 270 includes an inverter 272 coupled in series with a capacitor 274 between first input terminal 216 and output terminal 260. Feed-forward circuit 280 includes an inverter 282 coupled in series with a capacitor 284 between second input terminal 218 and output terminal 262. It is preferred that capacitors 274, 284 each have a value that is approximately ten per cent of the capacitive load of driver apparatus 200. Feed-forward circuit 270 is configured to assure that signals applied by feed-forward circuit 270 at output locus 260 (i.e., boost signals) are in-phase with signals applied at output locus 260 from first input terminal 216 via input section 212 and driver core section 214. Feed-forward circuit 280 is configured to assure that signals applied by feed-forward circuit 280 at output locus 262 (i.e., boost signals) are in-phase with signals applied at output locus 262 from first input terminal 218 via input section 212 and driver core section 214. Such direct providing of in-phase boost signals via feed-forward circuits 270, 280 to output loci 260, 262 immediately positively affects rise times and fall times of signals appearing at output loci 260, 262.

One prior art attempt at boosting output signals for similar driver apparatuses provided feed-forward connections between input loci 216, 218 and forward connection loci between inverters 220, 222 and between inverters 130, 132. Another prior art attempt at boosting output signals for similar driver apparatuses provided feed-forward connections between input loci 216, 218 and core input terminals 224 234. Yet another prior art attempt to effect boosting of output signals for similar driver apparatuses momentarily applies a raised voltage across the output loci, such as across circuitry between source 124 and drain 134 (FIG. 2). Such an approach momentarily boosts current of the output signal at output loci (e.g., output loci 60, 62) and makes the driver apparatus (e.g. driver apparatus 10; FIG. 1) operate as a voltage driven driver device.

The problems with such prior art attempts at boosting output signals for driver apparatuses are that they all accomplish boosting too late in time. This is so because, by the time the boosting signal is applied, the signal at each of output loci (e.g., output loci 62, 64) is already moving toward a signal limit.

The present invention provides a straightforward approach to assuring that an in-phase boost signal is applied to the driver output in a timely manner to improve rise time and fall time of the output signal. The in-phase nature of the boost signal vis-à-vis the output signal is assured because the boost signal originates from the same input signal that is the origin of the output signal that is being subjected to boosting.

Figure 4:
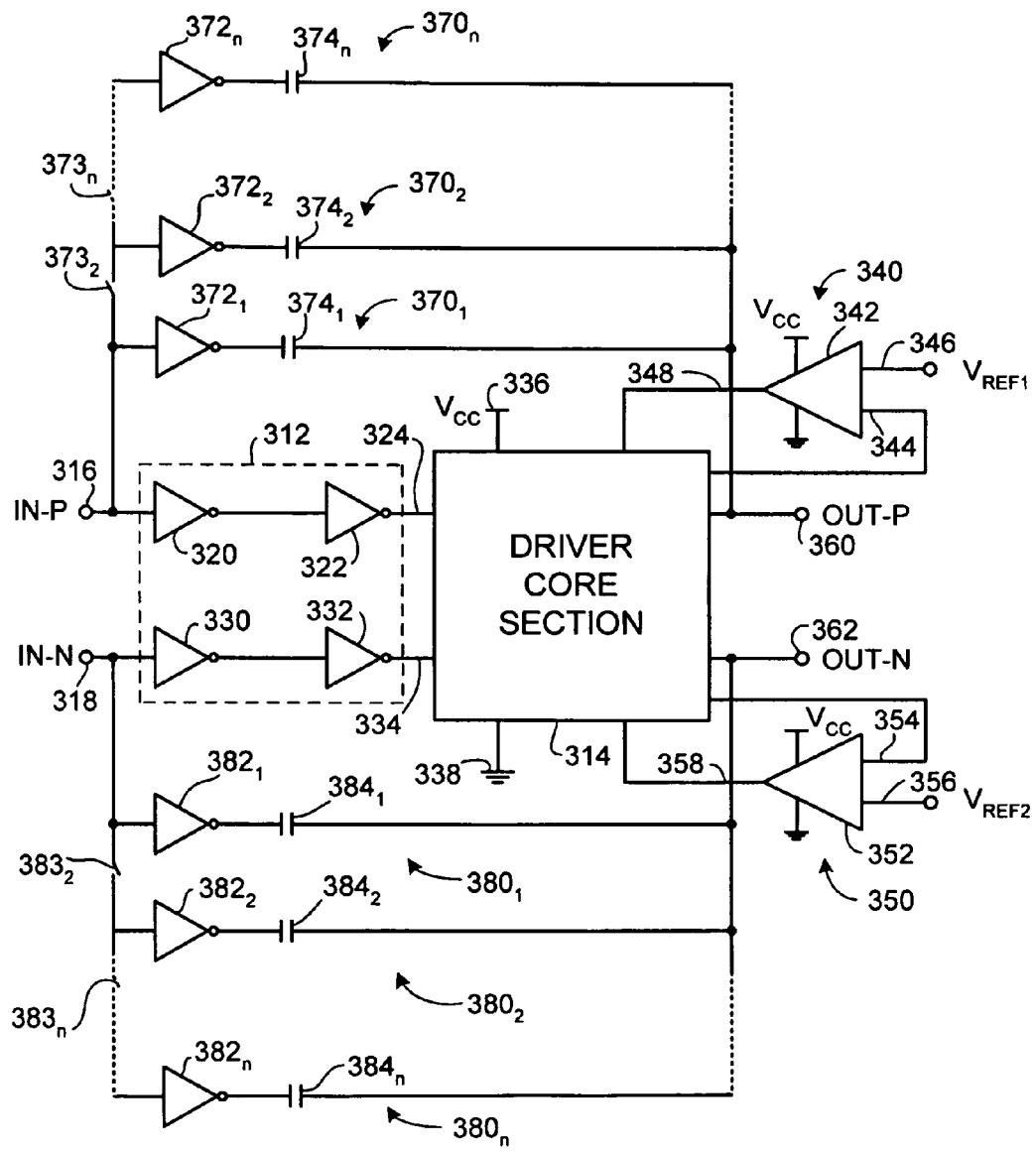
FIG. 4 is an electrical schematic diagram of a driver apparatus employing an alternate embodiment of the present invention.

FIG. 4 is an electrical schematic diagram of a driver apparatus employing an alternate embodiment of the present invention. In FIG. 4, a driver apparatus 300 includes an input section or locus 312 and a driver core section 314. Preferably, driver core section 314 is configured substantially as a buffering amplifier device of the sort illustrated in FIG. 2 (not shown in detail in FIG. 4). Driver apparatus 300 is configured, by way of example and not by way of limitation, as a differential signaling driver receiving a first input signal IN-P at a first input terminal 316 and receiving a second input signal at a second input terminal 318. Driver apparatus 300 may be configured for handling single-ended signaling without departing from the scope of the present invention. In representative driver circuit 300, input section 312 includes a pair of inverters 320, 322 coupled in series between first input locus 316 and a first core input terminal 324. Input section 312 also includes a pair of inverters 330, 332 coupled in series between second input locus 318 and a second core input terminal 334. Driver core section 314 receives a supply voltage $V_{CC}$ at a supply voltage input terminal 336. Driver core section 314 is coupled with ground 338.

A first regulating circuit 340 includes an amplifier 342 having a first input terminal 344 receiving a first input signal from driver core section 314 and a second input terminal 346 coupled to receive a first reference voltage $V_{REF1}$. An output terminal 348 is coupled to provide a first regulating signal to driver core section 314. The first regulating signal provided at output terminal 348 is dependent upon the relationship between signals appearing at input terminals 344, 346. A second regulating circuit 350 includes an amplifier 352 having a first input terminal 354 receiving a first input signal from driver core section 314 and a second input terminal 356 coupled to receive a second reference voltage $V_{REF2}$. An output terminal 358 is coupled to provide a second regulating signal to driver core section 314. The second regulating signal provided at output terminal 358 is dependent upon the relationship between signals appearing at input terminals 354, 356. Regulating circuits 340, 350 cooperate to regulate common mode voltage of differential output signals presented at output loci 360, 362 as supply voltage $V_{CC}$ varies.

Driver apparatus 300 presents output signals at output terminals or loci 360, 362.

Driver apparatus 300 includes a plurality of feed-forward circuits $370_1$, $370_2$, $370_n$ that feed forward signals from input terminal 316 to output terminal 360. Feed-forward circuit $370_1$ includes an inverter $372_1$ coupled in series with a capacitor $374_1$ between first input terminal 316 and output terminal 360. Feed-forward circuit $370_2$ includes an inverter $372_2$ coupled in series with a capacitor $374_2$ between first input terminal 316 and output terminal 360. Feed-forward circuit $370_n$ includes an inverter $372_n$ coupled in series with a capacitor $374_n$ between first input terminal 316 and output terminal 360. Driver apparatus 300 also includes a plurality of feed-forward circuits $380_1$, $380_2$, $380_n$ that feed forward signals from input terminal 318 to output terminal 362. Feed-forward circuit $380_1$ includes an inverter $382_1$ coupled in series with a capacitor $384_1$ between second input terminal 318 and output terminal 362. Feed-forward circuit $380_2$ includes an inverter $382_2$ coupled in series with a capacitor $384_2$ between second input terminal 318 and output terminal 362. Feed-forward circuit $380_n$ includes an inverter $382_n$ coupled in series with a capacitor $384_n$ between second input terminal 318 and output terminal 362. It is preferred that capacitors $370_n$, $380_n$ each have a value that is approximately ten per cent of the capacitive load of driver apparatus 300. The indicator "n" is employed to signify that there can be any number of feed-forward circuits in driver apparatus 300. The inclusion of three feed-forward circuits $370_n$ and three feed-forward circuits $380_n$ in driver apparatus 300 in FIG. 4 is illustrative only and does not constitute any limitation regarding the number of feed-forward circuits that may be included in the driver apparatus of the present invention.

Switches $373_1$, $373_n$ select which feed-forward circuits $370_n$ participate in operation of driver device 300. Switches $383_1$, $383_n$ select which feed-forward circuits $380_n$ participate in operation of driver device 300.

Using the configuration of FIG. 4, one may select one, two or n feed forward circuits $370_n$, $380_n$ to participate in operation of driver device 300 to accommodate different characteristics (e.g., capacitive or inductive characteristics) of loads coupled with output loci 360, 362.

Feed-forward circuits $370_n$, $380_n$ are configured to assure that signals applied by feed-forward circuits $370_n$, $380_n$ at output loci 360, 362 (i.e., boost signals) are in-phase with signals applied at output loci 360, 362 from input terminals 316, 318 via input section 312 and driver core section 314. Such direct providing of in-phase boost signals via feed-forward circuits $370_n$, $380_n$ to output loci 360, 362 immediately positively affects rise times and fall times of signals appearing at output loci 360, 362.

Figure 5:
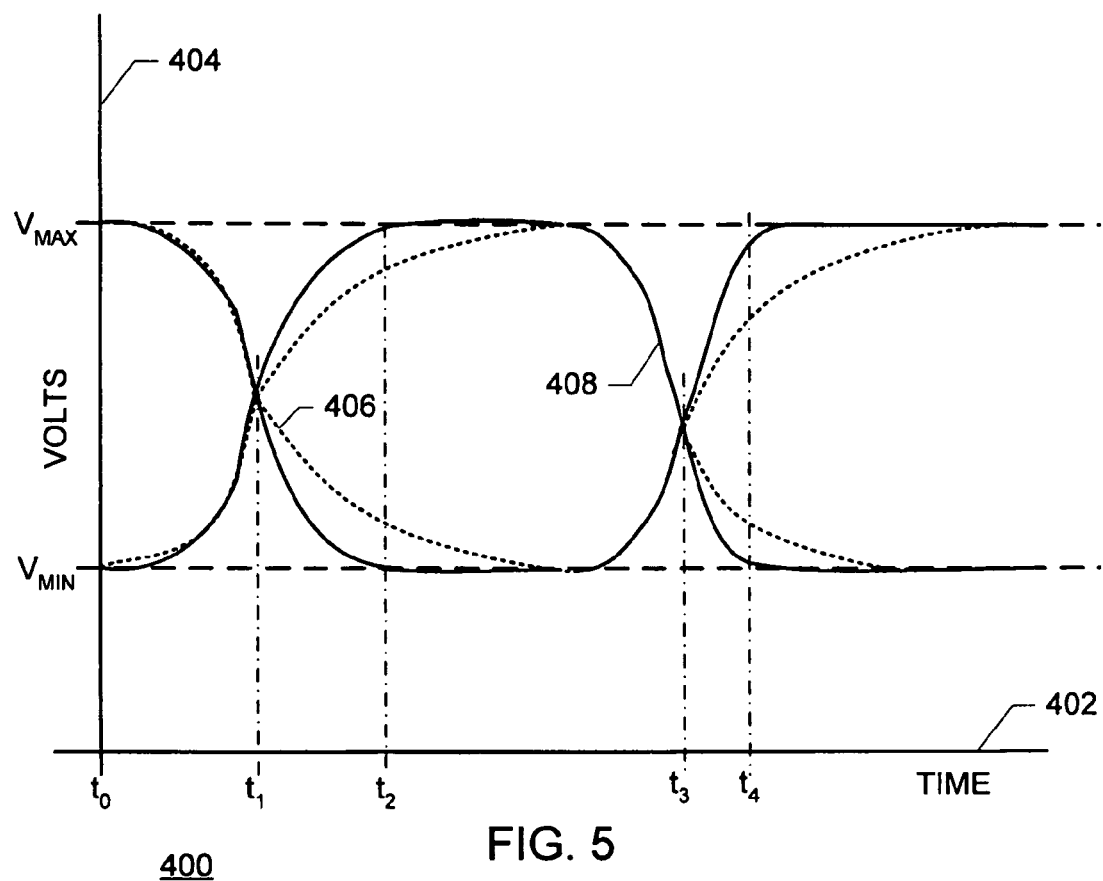
FIG. 5 is a graphical representation of output signals provided by a driver apparatus employing the present invention and a driver apparatus not employing the present invention.

FIG. 5 is a graphical representation of output signals provided by a driver apparatus employing the present invention and a driver apparatus not employing the present invention. In FIG. 5, a graphical representation 400 is illustrated with a horizontal axis 402, representing time, and a vertical axis 404, representing voltage. A first curve-set 406, illustrated in dotted-line format, represents differential signals appearing at output loci (e.g., output loci 260, 262) without employing the feed-forward circuitry of the present invention. A second curve-set 408, illustrated in solid-line format, represents differential signals appearing at output loci (e.g., output loci 260, 262) while employing the feed-forward circuitry of the present invention.

The rise time of signal 408 is significantly faster than the rise time of signal 406, as may be observed, for example, during the time interval $t_1$–$t_2$. At time $t_2$, the differential signal represented by curve 408 has substantially attained voltage level $V_{MAX}$, $V_{MIN}$, while the differential signal represented by curve 406 has yet to attain voltage level $V_{MAX}$, $V_{MIN}$. A similar difference in signal levels occurs at time $t_4$.

Figure 6:
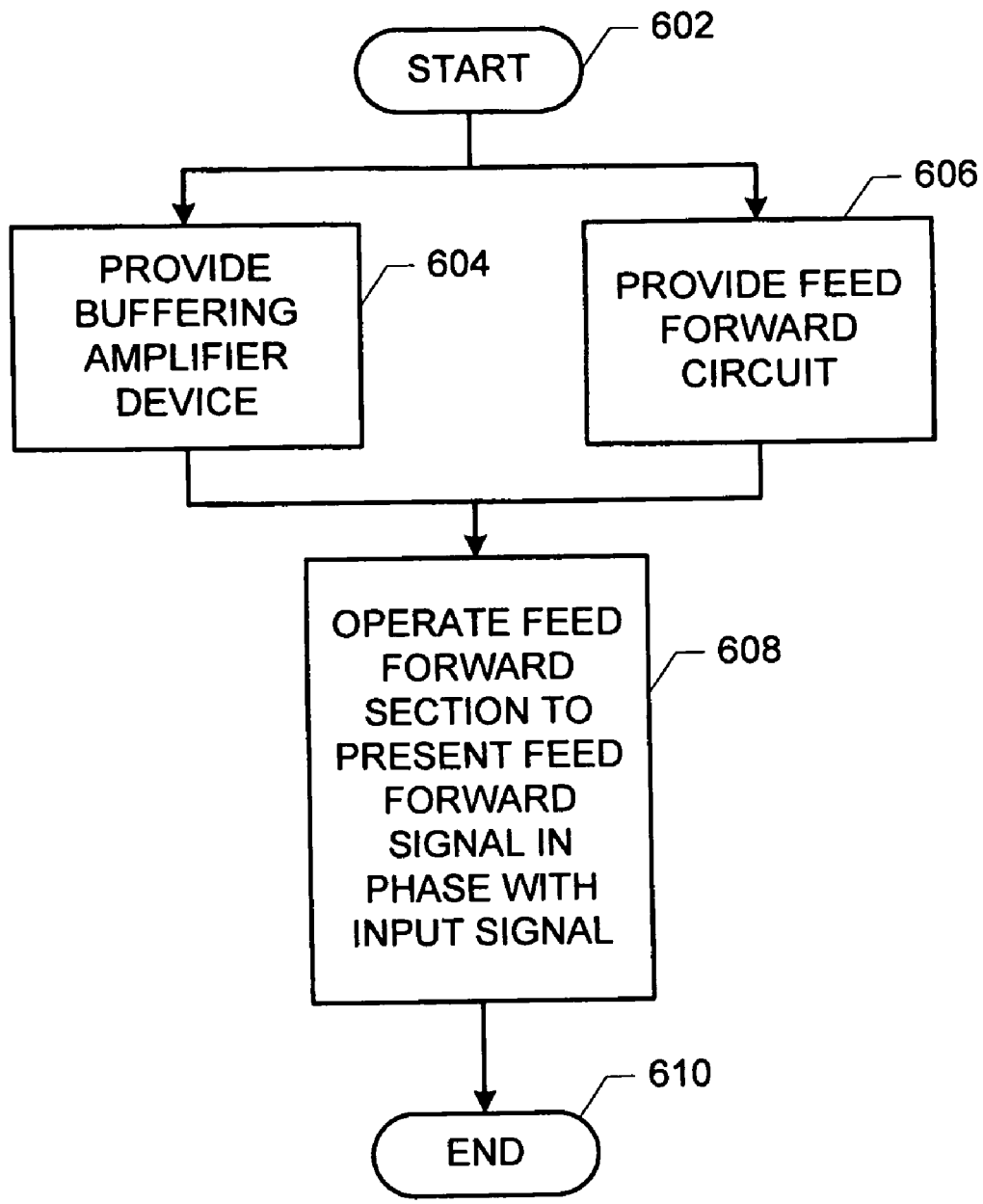
FIG. 6 is a flow diagram illustrating the method of the present invention.

FIG. 6 is a flow diagram illustrating the method of the present invention. In FIG. 6, a method 600 for handling signaling between a sending device and a receiving device begins at a START locus 602. Method 600 continues with the step of, in no particular order: (1) providing a buffering amplifier device having at least one input locus for receiving an input signal from the sending device and having at least one output locus for presenting an output signal for the receiving device; each respective at least one output locus presenting the output signal in response to the input signal received at a respective input locus, as indicated by a block 604; and (2) providing a feed forward circuit coupling each respective input locus with its respective corresponding output locus to provide a feed forward signal to the respective corresponding output locus, as indicated by a block 606.

Method 600 continues with the step of operating the feed forward circuit to present the feed forward signal at the respective corresponding output locus in phase with the input signal received at the respective input locus, as indicated by a block 608. Method 600 terminates at an END locus 610.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

The invention claimed is:

1. A driver apparatus for handling interdevice signaling between a sending device and a receiving device; the apparatus comprising:
   (a) a driver core section; said driver core section having at least one input locus for receiving an input signal from said sending device and having at least one output locus for presenting an output signal for said receiving device; each respective said at least one output locus presenting said output signal in response to said input signal received at a respective said input locus of said at least one input locus;
   (b) a feed forward circuit coupling each said respective input locus with its respective corresponding output locus to provide a feed forward signal to said respective corresponding output locus; said feed forward signal being in phase with said input signal,
   wherein said feed forward circuit is embodied in a plurality of n feed forward circuit segments coupled in parallel; selected feed forward circuit segments of said n feed forward circuit segments being switchably and separately capacitively connected with at least one of said respective input locus and a corresponding output locus for controlling electrical inclusion in the apparatus.

2. A driver apparatus for handling interdevice signaling between a sending device and a receiving device the apparatus comprising:
   (a) a driver core section; said driver core section having at least one input locus for receiving an input signal from said sending device and having at least one output locus for presenting an output signal for said receiving device; each respective said at least one output locus presenting said output signal in response to said input signal received at a respective said input locus of said at least one input locus; and
   (b) a feed forward circuit having a plurality of parallel connected feed forward circuits each of which separately capacitively coupling each said respective input locus with its respective corresponding output locus to provide a feed forward signal to said respective corresponding output locus; said feed forward signal being in phase with said output signal from said driver core section;
   (c) wherein said at least one input locus is two input loci and wherein said at least one output locus is two output loci; said signaling being effected as differential signaling; and
   wherein said feed forward circuit is embodied in a plurality of n feed forward circuit segments coupled in parallel; selected feed forward circuits of said n feed forward circuit segments being switchably and separately capacitively connected with at least one of said respective input locus and a corresponding output locus for controlling electrical inclusion in the apparatus.

3. A driver apparatus for handling interdevice signaling between a sending device and a receiving device; the apparatus comprising:
   (a) a driver core section; said driver core section having at least one input locus for receiving an input signal from said sending device and having at least one output locus for presenting an output signal for said receiving device; each respective said at least one output locus presenting said output signal in response to said input signal received at a respective said input locus of said at least one input locus;
   (b) a feed forward circuit coupling each said respective input locus with its respective corresponding output locus to provide a feed forward signal to said respective corresponding output locus; said feed forward signal being in phase with said input signal,
   wherein said feed forward circuit is embodied in a plurality of n feed forward circuit segments coupled in parallel; selected feed forward circuits of said n feed forward circuit segments being switchably and separately capacitively connected with at least one of said respective input locus and a corresponding output locus for controlling electrical inclusion in the apparatus.

4. An apparatus for handling signaling between a sending device and a receiving device; the apparatus comprising:
   (a) a buffering amplifier device having at least one input locus for receiving an input signal from said sending device and having at least one output locus for presenting an output signal for said receiving device; each respective said at least one output locus presenting said output signal in response to said input signal received at a respective said input locus of said at least one input locus;
   (b) a feed forward circuit coupling each said respective input locus with its respective corresponding output locus to provide a feed forward signal to said respective corresponding output locus; said feed forward signal,
   wherein said feed forward circuit is embodied in a plurality of n feed forward circuit segments coupled in parallel; selected feed forward circuit segments of said n feed forward circuit segments being switchably and separately capacitively connected with at least one of said respective input locus and a corresponding output locus for controlling electrical inclusion in the apparatus.

5. An apparatus for handling signaling between a sending device and a receiving device the apparatus comprising:
   (a) a buffering amplifier device having at least one input locus for receiving an input signal from said sending device and having at least one output locus for presenting an output signal for said receiving device; each respective said at least one output locus presenting said output signal in response to said input signal received at a respective said input locus of said at least one input locus;

(b) a feed forward circuit having a plurality of parallel connected feed forward circuits each of which separately capacitively coupling each said respective input locus with its respective corresponding output locus to provide a feed forward signal to said respective corresponding output locus; said feed forward signal; and (c) respective input circuitry at each said respective input locus; said feed forward circuit being coupled with said respective input locus at a connection point distal from said buffering amplifier device;

(d) wherein said at least one input locus is two input loci and wherein said at least one output locus is two output loci; said signaling being effected as differential signaling; and (e) wherein said feed forward circuit is embodied in a plurality of n feed forward circuit segments coupled in parallel; selected feed forward circuits of said n feed forward circuit segments being switchably connected with at least one of said respective input locus and a corresponding output locus for controlling electrical inclusion in the apparatus.

6. A method for handling signaling between a sending device and a receiving device; the method comprising the steps of:

(a) in no particular order:
  (1) providing a buffering amplifier device having at least one input locus for receiving an input signal from said sending device and having at least one output locus for presenting an output signal for said receiving device; each respective said at least one output locus presenting said output signal in response to said input signal received at a respective said input locus of said at least one input locus; and
  (2) providing a feed forward circuit coupling each said respective input locus with its respective corresponding output locus to provide a feed forward signal to said respective corresponding output locus; and (b) operating said feed forward circuit to present said feed forward signal at said respective corresponding output locus in phase with said input signal, wherein said feed forward circuit is embodied in a plurality of n feed forward circuit segments coupled in parallel; selected feed forward circuit segments of said n feed forward circuit segments being switchably and separately capacitively connected with at least one of said respective input locus and a corresponding output locus for controlling electrical inclusion in the apparatus.

7. A method for handling signaling between a sending device and a receiving device, the method comprising the steps of:

(a) in no particular order:
  (1) providing a buffering amplifier device having at least one input locus for receiving an input signal from said sending device and having at least one output locus for presenting an output signal for said receiving device; each respective said at least one output locus presenting said output signal in response to said input signal received at a respective said input locus of said at least one input locus;
  (2) providing a feed forward circuit having a plurality of parallel connected feed forward circuits each of which separately capacitively coupling each said respective input locus with its respective corresponding output locus to provide a feed forward signal to said respective corresponding output locus; and
  (3) providing, in no particular order, respective input circuitry at each said respective input locus; said feed forward circuit being coupled with said respective input locus at a connection point distal from said buffering amplifier device; and (b) operating said feed forward circuit to present said feed forward signal at said respective corresponding output locus in phase with said output signal from said buffering amplifier device;

(c) wherein said at least one input locus is two input loci and wherein said at least one output locus is two output loci; said signaling being effected as differential signaling; and (d) wherein said feed forward circuit is embodied in a plurality of n feed forward circuit segments coupled in parallel; selected feed forward circuits of said n feed forward circuit segments being switchably connected with at least one of said respective input locus and a corresponding output locus for controlling electrical inclusion in the apparatus.

* * * * *